United States Patent
Kawabe et al.

(10) Patent No.: US 8,154,434 B2
(45) Date of Patent: Apr. 10, 2012

(54) PIPELINED A/D CONVERTER

(75) Inventors: Akira Kawabe, Osaka (JP); Shinichi Ogita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/089,673

(22) Filed: Apr. 19, 2011

(65) Prior Publication Data

US 2011/0193730 A1     Aug. 11, 2011

Related U.S. Application Data

(63) Continuation of application No. PCT/JP2010/050877, filed on Jan. 25, 2010.

(30) Foreign Application Priority Data

Apr. 17, 2009   (JP) ................................. 2009-101145

(51) Int. Cl.
    *H03M 1/34*      (2006.01)

(52) U.S. Cl. ....................................... 341/162; 341/161

(58) Field of Classification Search .................. 341/162, 341/161, 118, 120, 110, 156, 155
See application file for complete search history.

(56) References Cited

U.S. PATENT DOCUMENTS

| 6,351,228 B1 | 2/2002 | Kutsuno et al. |
| 6,784,814 B1 * | 8/2004 | Nair et al. ...................... 341/118 |
| 2003/0184466 A1 | 10/2003 | Takeyabu et al. |

FOREIGN PATENT DOCUMENTS

| JP | 2000-295102 | 10/2000 |
| JP | 2003-298418 | 10/2003 |
| JP | 2006-109403 | 4/2006 |

* cited by examiner

*Primary Examiner* — Joseph Lauture
(74) *Attorney, Agent, or Firm* — Hamre, Schumann, Mueller & Larson, P.C.

(57) ABSTRACT

Multiple stages sequentially convert respective input analog signals to partial digital data. Each stage includes: a partial A/D converter; a partial D/A converter; an adder that adds/subtracts the analog signal from the previous stage and an output from the partial D/A converter; and a gain amplifier that amplifies an output of the adder and supplies to the next stage. The pipelined A/D converter further includes: a correction value adding unit that adds a correction value to the output from the decoder unit; a correction value calculating unit that, based on the output from the correction value adding unit, calculates an error between the median of the output data and an ideal median at two points in the stage input/output characteristics, saves the calculated value as the correction value and supplies it to the correction value adding unit; and a control unit that controls the above units so as to perform the correction operation. Thereby, aliasing at decoding of the stage output is prevented, enabling an output range to be used effectively.

7 Claims, 5 Drawing Sheets

US 8,154,434 B2

PIPELINED A/D CONVERTER

BACKGROUND OF THE INVENTION

1. Field of the Invention

The present invention relates to a technique for correcting an offset of a pipelined A/D converter.

2. Description of Related Art

A pipelined A/D converter is characterized in that it is formed by cascading low-bit-rate A/D converters. By connecting a required number of stages of low-bit-rate A/D converters, a desired bit accuracy can be obtained. Further, since such a converter has a relatively simple configuration provided by connecting unit functioning blocks called pipeline stages, it can be used for various applications, such as digital still cameras and digital video cameras.

On the other hand, the characteristics required for the A/D converter (DNLE: differential non-linear error; INLE: integral non-linear error) may be degraded due to fine-line processing, speed enhancement, voltage reduction and the like. To cope with this problem of characteristic degradation, various correction techniques have been proposed. One of the most widespread techniques is a method of correcting stage error (see JP 2003-298418 A, FIG. 1) or the like.

FIG. 4 is a block diagram showing a configuration example of a typical pipelined A/D converter. In FIG. 4, numeral 21 denotes a pipeline stage group including a plurality of pipeline stages P2k (k is an integer from 1 to n). An input analog signal AS2 as an A/D conversion target inputted from the exterior is inputted into a pipeline 1st stage P21. Partial digital data S2k (S21-S2n) outputted respectively by a plurality of pipeline stages P21-P2n are supplied to a shift register unit 22 formed of a shift register group. The partial digital data S2k is subjected to a timing adjustment by the shift register unit 22 and is supplied as adjusted partial digital data SR2k (SR21-SR2n) to the decoder unit 23. The adjusted partial digital data SR21-SR2n are subjected to an operation by the decoder unit 23, and outputted as ADC output DS2.

FIG. 5 is a block diagram showing an example of a typical configuration of each of the pipeline stages P2k in FIG. 4. The pipeline stage P2k includes an adder 24, a low-bit-rate partial A/D converter 25, and a partial D/A converter 26. An input analog signal AS2 or an output analog signal AS2k of a more significant stage is inputted into the adder 24 and the low-bit-rate partial A/D converter 25. The output of the partial A/D converter, which is partial digital data S2k, is outputted as a pipeline stage output and at the same time inputted into the partial D/A converter 26. A reference analog signal outputted by the partial D/A converter 26 is inputted into the adder 24 so as to be subjected to an operation with either the input analog signal AS2 or an output analog signal AS2k of a more significant stage. The resulting signal is amplified by the gain amplifier 27 so as to form an output analog signal and supplied to a less significant stage.

FIG. 6 shows an example of a general configuration of the shift register unit 22 in FIG. 4. The shift register unit 22 is formed of a plurality of delay sections 28. A required number of delay sections 28 are cascaded in accordance with the output delay of the pipeline stage, thereby adjusting the timing among the partial digital data S21-S2n.

Operations of the pipelined A/D converter configured as described above will be explained briefly below. The analog signal AS2 is first inputted into the pipeline 1st stage P21 and digitalized by the partial A/D converter 25. In general, a partial A/D converter 25 of 1.5 bits that outputs three values (00, 01, 10) is used often. Partial digital data S2k outputted by the partial A/D converter 25 are subjected to timing adjustment at the shift register unit 22 and also analog-converted by the partial D/A converter 26. The analog-converted signal is subjected to an operation with the inputted analog signal (AS2 or AS2k) by the adder 24, amplified by the gain amplifier 27 and outputted. In a case of a pipeline stage of 1.5 bits, in general, the gain of the gain amplifier 27 is double. The series of operations are conducted similarly in the less significant pipeline stages.

On the other hand, the adjusted partial digital data SR21-SR2n, which are obtained by subjecting partial digital data S21-S2n to timing adjustment at the shift register unit 22, are supplied to the decoder unit 23, and added together at the decoder unit 23. Thereby A/D converted digital data DS2 having a desired number of bits are obtained.

Prior Art Documents

Patent document 1: JP 2003-298418 A (FIG. 1)

SUMMARY OF THE INVENTION

In the configuration of the pipeline stage group 21, outputs in the input/output characteristics may shift upward or downward due to various factors. FIG. 7 shows one example of input/output characteristics of a pipeline stage of 1.5 bits. In FIG. 7, the value of an analog signal inputted into each pipeline stage is represented by the input axis 30 (x-axis). The value of an analog signal outputted by each pipeline stage is represented by an output axis 31 (y-axis). A characteristic line 32 as a solid line indicates ideal input/output characteristics, and a characteristic line 33 as a broken line indicates input/output characteristics shifted upward.

VREF indicates the absolute value of the upper and lower limits in the input range of a pipelined A/D converter. Pipeline stage output SPS (corresponding to S2k in FIG. 4) takes digital data of three values (00, 01, 10). −VREF/4 and +VREF/4 are boundary values for selecting the digital data output of three values. VE indicates an error value of an analog output signal for a case of the input/output characteristics expressed with the broken line 33.

The errors in the input/output characteristics of the A/D converter, which is caused by the errors in the analog output signals at the respective pipeline stages as mentioned above, are shown in FIG. 8. The input axis 34 (x-axis) indicates the value of the analog signal inputted to the A/D converter, and the output axis 35 (y-axis) indicates the value of the partial digital data. A characteristic line 36 as an alternate long and short dashed line indicates the ideal input/output characteristics, and a characteristic line 37 as a solid line indicates the input/output characteristics with error shifted upward.

In this manner, when a vertical shift occurs in the input/output characteristics of the pipeline stages, the output of the A/D converter exceeds the upper limit of the digital output value, and thus an aliasing occurs in the decoder output. In general, clipping is performed to prevent the aliasing. However, as a result of the clipping, conversion data in the excess is wasted, and thus the output range of the A/D converter cannot be used effectively.

Therefore, with the foregoing in mind, it is an object of the present invention to provide a pipelined A/D converter that corrects a vertical shift error generated in the input/output characteristics of pipeline stages and prevents aliasing at the time of decoding the digital output values of respective stages, thereby enabling effective use of an output range of the A/D converter.

A pipelined A/D converter of the present invention is configured to: generate, from input analog signals, partial digital data corresponding to a part of bits, where the partial digital data is generated sequentially by cascaded multiple pipeline stages; adjust a timing delay through a pipeline procedure for the partial digital data obtained from the respective pipeline stages; and subsequently add the data together by use of a decoder unit so as to output digital data.

Each of the pipeline stages includes a low-bit-rate partial A/D converter that quantizes either the input analog signal or an output analog signal outputted from the previous pipeline stage and generates the partial digital data; a low-bit-rate partial D/A converter that converts the partial digital data outputted by the partial A/D converter into a reference analog signal; an adder that performs addition/subtraction of the reference analog signal outputted by the partial D/A converter, with respect to the output analog signal; and a gain amplifier that amplifies an output signal from the adder and supplies the signal as the output analog signal to the next pipeline stage.

For solving the above-mentioned problems, the pipelined A/D converter of the present invention further includes: a correction value adding unit that is supplied with the digital data outputted by the decoder unit as a first input and a correction value as a second input, and adds the first input and the second input so as to provide output data; a correction value calculating unit that calculates a median between the output data at arbitrary two points in input/output characteristics of the pipeline stage by using the output of the correction value adding unit as an input, calculates an error between the calculated median and an ideal median, saving the error as the correction value, and outputs the correction value to the correction value adding unit; and a control unit that sets a correction period other than the normal operation period and controls during the correction period the pipeline stage and the correction value calculating unit so as to perform a correction operation of calculating the error.

Here, the ideal median is defined as a median of two points that correspond to two arbitrary points of the input/output characteristics and that are included in ideal input/output characteristics of the pipeline stage.

According to the pipelined A/D converter configured as mentioned above, since the input/output characteristics of the partial A/D converter can be corrected with reference to an ideal median, it is possible to decrease data that will be wasted due to clipping and to utilize effectively the output range of the A/D converter.

DETAILED DESCRIPTION OF THE INVENTION

Basically, a pipelined A/D converter of the present invention is configured as mentioned above and can be modified as described below.

Namely, the least significant stage of the pipeline stages can be configured by a flash A/D converter of arbitrary bits.

It is preferable that the control unit sets the pipeline stage as a correction target from arbitrary less significant stages and controls the input and output of the pipeline stages so as to move sequentially to the more significant side for performing the correction operation.

Further, the control unit can be configured to set input values and output values for the arbitrary two points for the purpose of calculating the median with respect to the pipeline stage as a correction target.

Further, the correction value calculating unit can be configured to output zero before the correction operation so as to make the output from the correction addition unit equivalent to the output from the decoder unit.

Further, the correction value calculating unit can be configured to calculate the median by use of an output from the correction value adding unit corresponding to the two points set by the control unit.

Further, the pipeline stage can be configured to be controlled during the correction operation so as to interrupt a normal input and to input a set value corresponding to the arbitrary two points.

The disclosure of Japanese Patent Application No. 2009-101145 filed Apr. 17, 2009, including the specification, drawings and claims, is incorporated herein by reference in its entirety Hereinafter, the pipelined A/D converter according to an embodiment of the present invention will be described with reference to the attached drawings.

(Embodiment)

Figure 1:
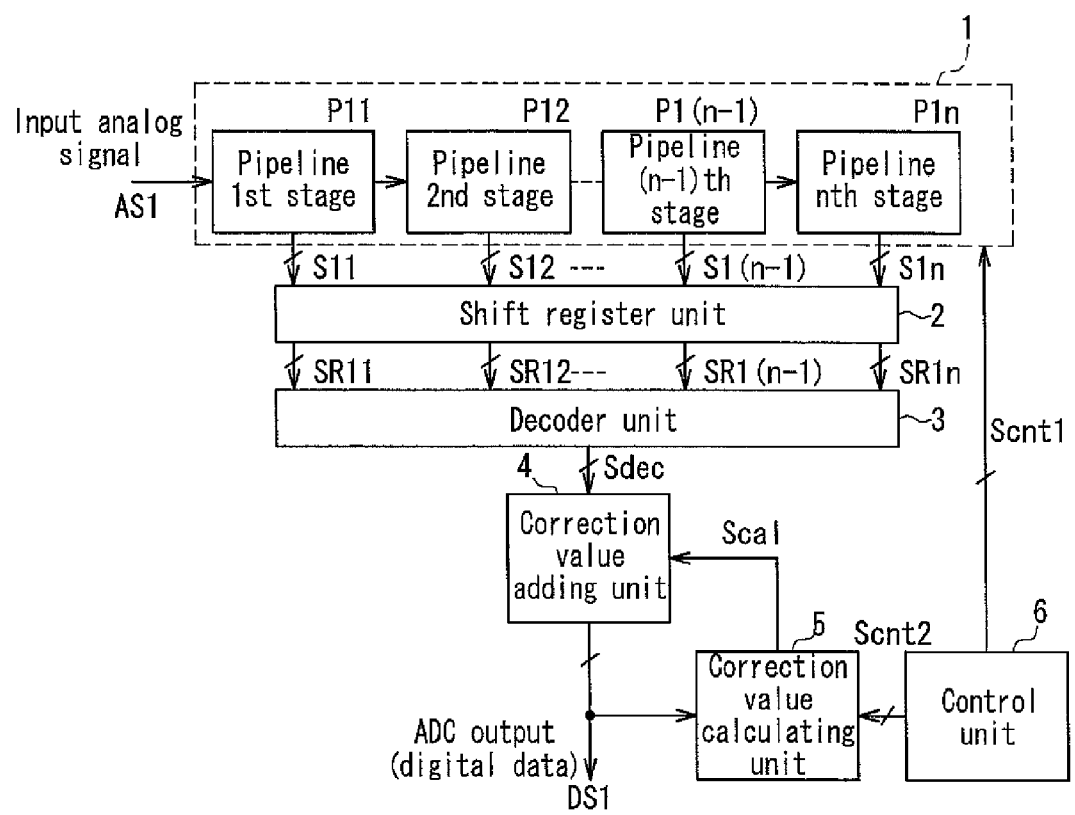
FIG. 1 is a block diagram showing a pipelined A/D converter in one embodiment of the present invention.

FIG. 1 is a block diagram showing a configuration example of a pipelined A/D converter according to an embodiment of the present invention. This pipelined A/D converter has, for a normal operation, a basic configuration including a pipeline stage group 1, a shift register unit 2 and a decoder unit 3, and furthermore, for a correction operation, a correction value adding unit 4, a correction value calculating unit 5 and a control unit 6.

The pipeline stage group 1 is configured by cascading multiple pipeline stages P1k (k is an integer from 1 to n). Each of the pipeline stages P1k has the substantially same configuration as that shown in FIG. 5. However, as mentioned below with reference to FIG. 3, a unit for correction operation is added to a stage to be corrected. And, the least significant stage Pin can be configured by a flash A/D converter of arbitrary bits.

Into the most significant pipeline 1st stage P11, an input analog signal AS1 from the exterior, which is an A/D conversion target, is inputted. Into each of the pipeline stages P12-P1n that are less significant than the 1st stage P11, an output analog signal AS1k of a more significant stage is inputted. Partial digital data S1k generated by each of the pipeline stage P1k is inputted into the shift register unit 2 composed of a shift register group. The shift register unit 2 adjusts the timing for the respective partial digital data S11-S1n in accordance with the delay at the respective pipeline stages, and outputs the data as adjusted partial digital data SR1k.

The adjusted partial digital data SR11-SR1n outputted from the shift register unit 2 are inputted into the decoder unit 3, added together to generate A/D conversion data Sdec. The A/D conversion data Sdec outputted from the decoder unit 3 are inputted into the correction value adding unit 4, to which correction value data Seal supplied by the correction value calculating unit 5 is added. Thereby, A/D conversion data DS1 where a shift error has been corrected is outputted as an output (digital data) of the pipelined A/D converter.

The correction value calculating unit 5 calculates an error in the input/output characteristics of the pipeline stage during the below-mentioned correction period, and saves the error as correction value data Scal. The error in the input/output characteristics in the pipeline stage can be calculated based on the output of the correction value adding unit 4 as an error in the output data between the median of arbitrary two points in the input/output characteristics of the pipeline stage and the ideal median (the corresponding median in the ideal input/output characteristics). The correction value calculating unit 5 outputs zero before the correction operation so as to make the output from the correction addition unit 4 equivalent to the output of the decoder unit 3.

The control unit 6 controls the operations of the pipeline stage group 1 and the correction value calculating unit 5 for correcting a shift error caused by the input/output characteristics of the pipeline stages P11-P1n. The Scnt1 as shown in FIG. 1 is a control signal for controlling the pipeline stage group 1 and Scnt2 is a control signal for controlling the correction value calculating unit 5. With these control signals, the pipeline stage group 1 and the correction value calculating unit 5 are controlled to perform the operations as described below.

Figure 7:
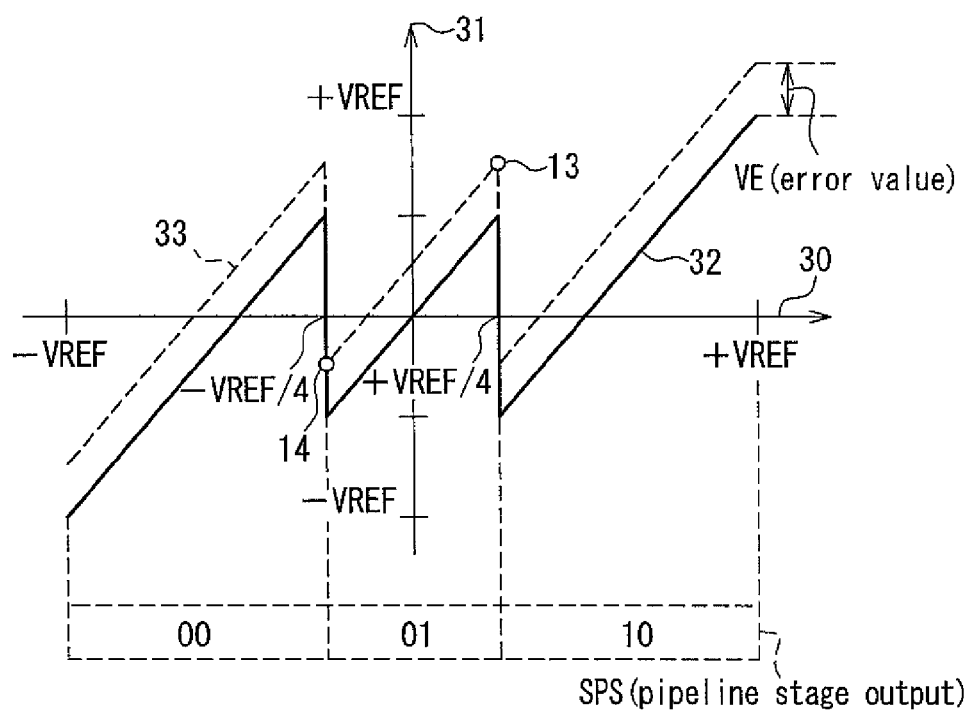
FIG. 7 is a diagram showing an example of input/output characteristics of a pipeline stage included in a pipelined A/D converter.

First, with reference to FIG. 7, an example of shift errors will be described. Though FIG. 7 shows input/output characteristics of a pipeline stage in a conventional example, this can be applied also to the input/output characteristics for the pipeline stage of the present embodiment. A pipeline stage output SPS takes three values (00, 01, 10), and corresponds to the partial digital data S11-S1n in FIG. 1.

According to the present embodiment, correction input points 13, 14 as shown in FIG. 7 are set at the control unit 6. The points are used, as mentioned above, to calculate the error in the output data between a median of arbitrary two points in the input/output characteristics of the pipeline stages and an ideal median. Here, for the correction input point 13, an input value is set at +VREF/4 and an output value is set at (01). For the correction input point 14, the input value is set at −VREF/4 and the output data is set at (01). The error value VE is the value to be corrected.

Figure 2:
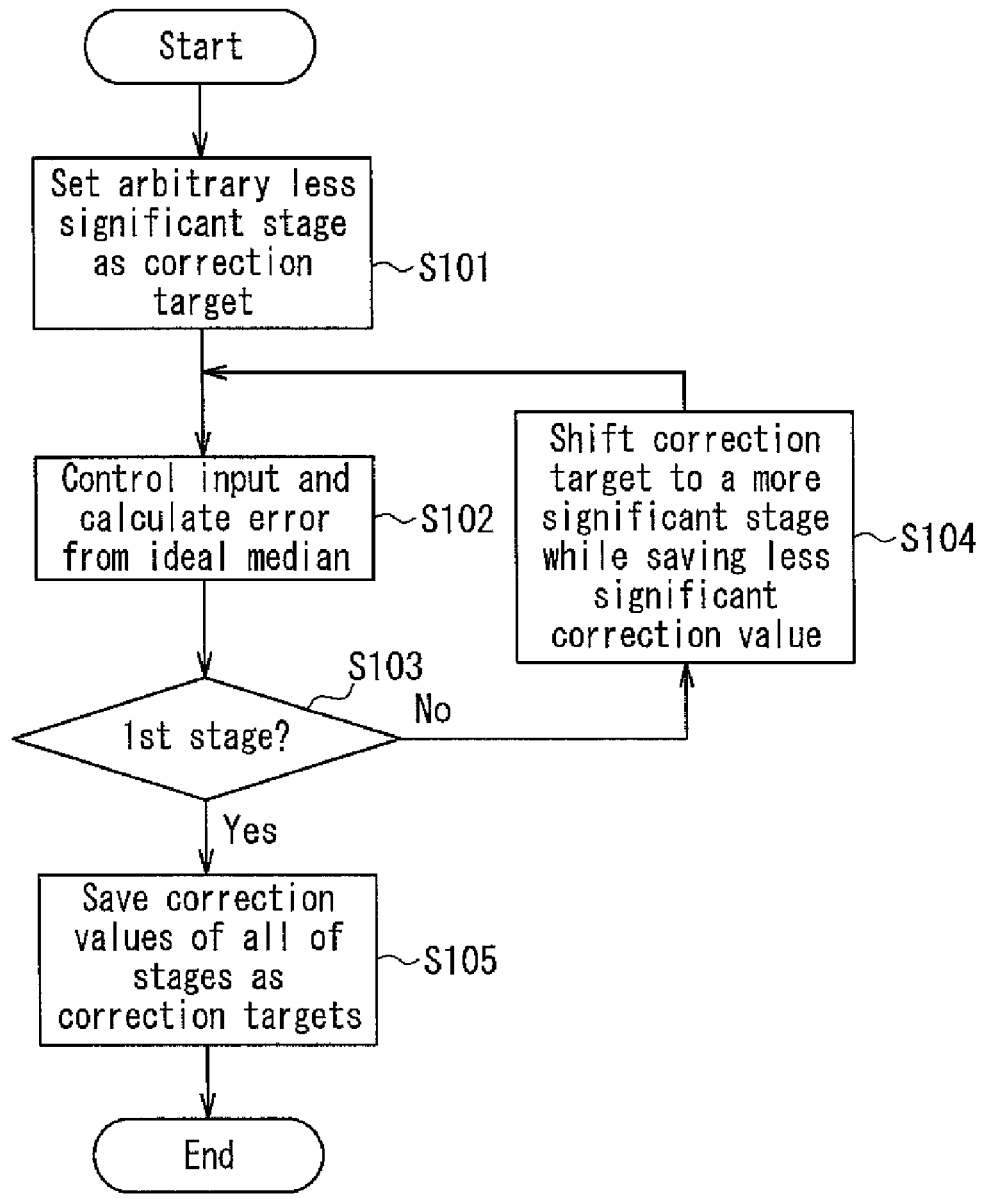
FIG. 2 is a flow chart showing an example of a correction method to be applied to the pipelined A/D converter.

FIG. 2 is a flow chart showing an example of a correction method of the present embodiment, performed by use of the pipelined A/D converter configured as mentioned above.

In the flow as shown in FIG. 2, when the correction period starts, first in a step S101, an arbitrary less significant pipeline stage is set to be a stage as a correction target by the control unit 6. Next in a step S102, by the control unit 6, the error between the median in the input/output characteristics of the pipeline stage as a correction target and an ideal median is detected. At that time, with use of the correction input points 13 and 14, the stage as a correction target is controlled, with +VREF/4 and −VREF/4 as input values and (01) as output data. A configuration example of the pipeline stage for this application will be described below with reference to FIG. 3.

A/D conversion data Sdec is used for detecting the errors. This A/D conversion data Sdec has been obtained by the decoder unit 3 by decoding output data provided by pipeline stages following the stage as a correction target. The output level of the median can be calculated easily by adding and averaging the A/D conversion data Sdec respectively outputted in accordance with the correction input points 13, 14. The output level of the ideal median can be calculated based on the above-described definition from the values corresponding to the correction input points 13, 14 in the ideal input/output characteristics. The correction value calculating unit 5 saves as the correction value data the difference in the thus calculated output level between the actually obtained median and the ideal median.

Next, in a step S103, it is decided whether the stage is the most significant (1st stage) or not. When the stage is not the 1st stage, the procedure goes to a step S104, so as to shift the stage as a correction target to the next and more significant stage while saving the correction value data corresponding to a stage as a correction target, and returns to the flow of the step S102. Subsequently, up to the 1st stage, correction value data corresponding to the stage as a correction target is saved and the next stage as correction target is shifted to the next and more significant stage, and the same operations are repeated. Through sequent addition, the correction value data can be handled as a correction value for the stage as a correction target.

In the conditional branching in the step S103, if it is the 1st stage, the procedure goes to the step S105. In the flow of the step S105, the correction values for all of the stages as correction targets are added together and saved as correction value data Scal of the pipelined A/D converter in this correction period, and the correction period is ended. Subsequently, by operating the pipelined A/D converter as the normal operation period, a converted output from which the shift error has been canceled by the saved correction value data Scal can be obtained.

Figure 3:
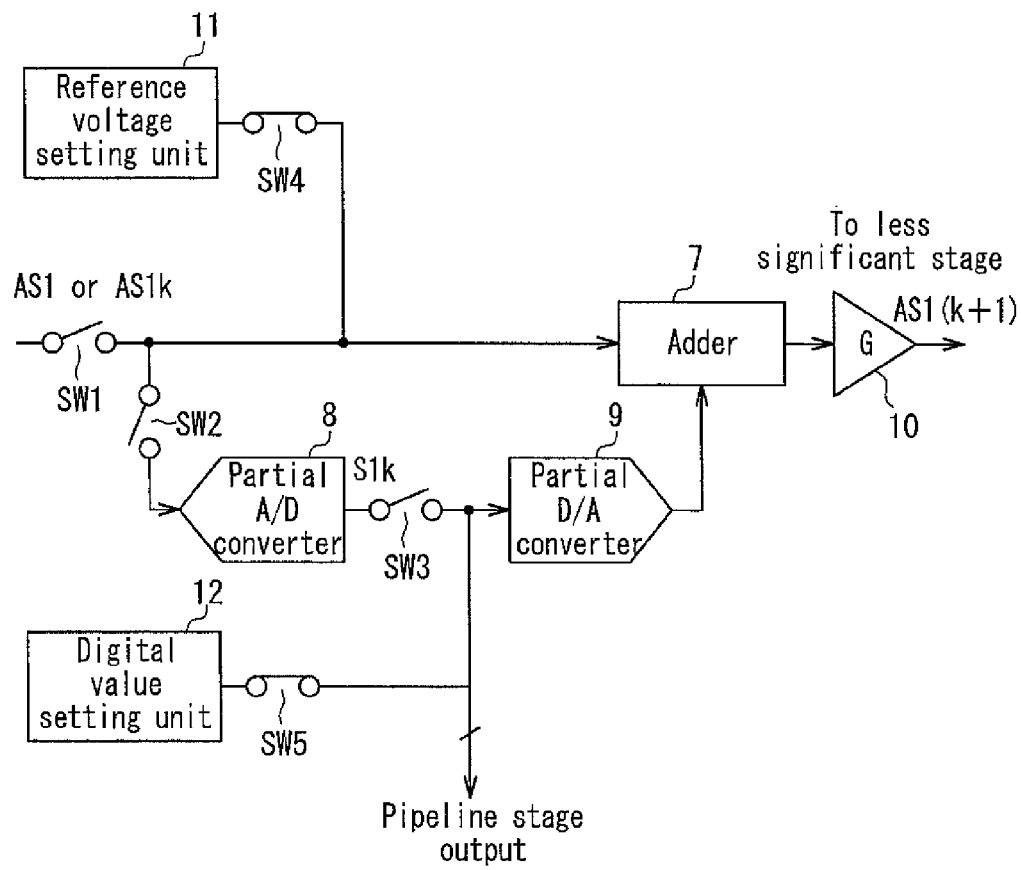
FIG. 3 is a block diagram showing a configuration example of a pipeline stage as a correction target included in the pipelined A/D converter.
Figure 4:
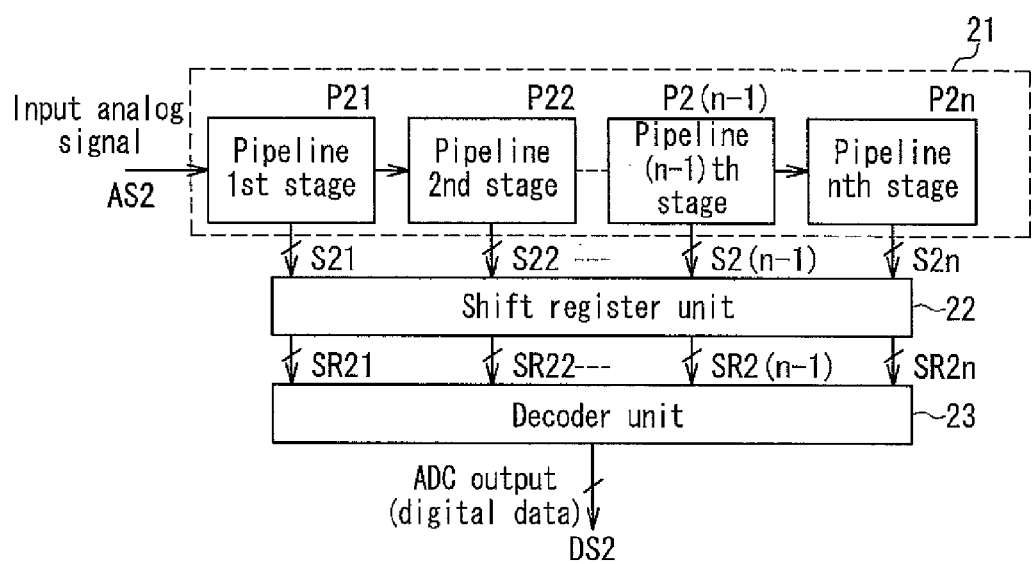
FIG. 4 is a block diagram showing a configuration example of a conventional and general pipelined A/D converter.
Figure 5:
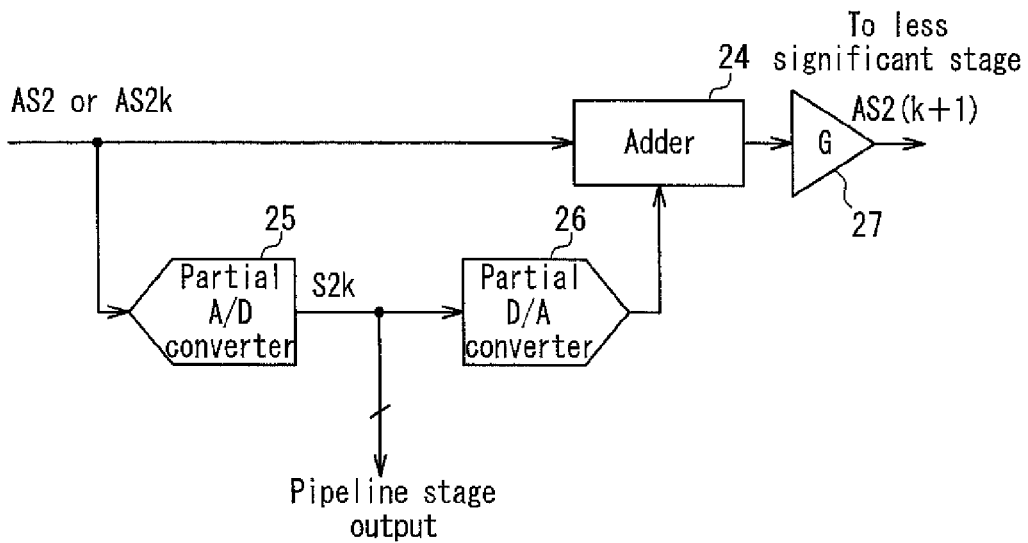
FIG. 5 is a block diagram showing a configuration example of a pipeline stage included in the pipelined A/D converter.
Figure 6:
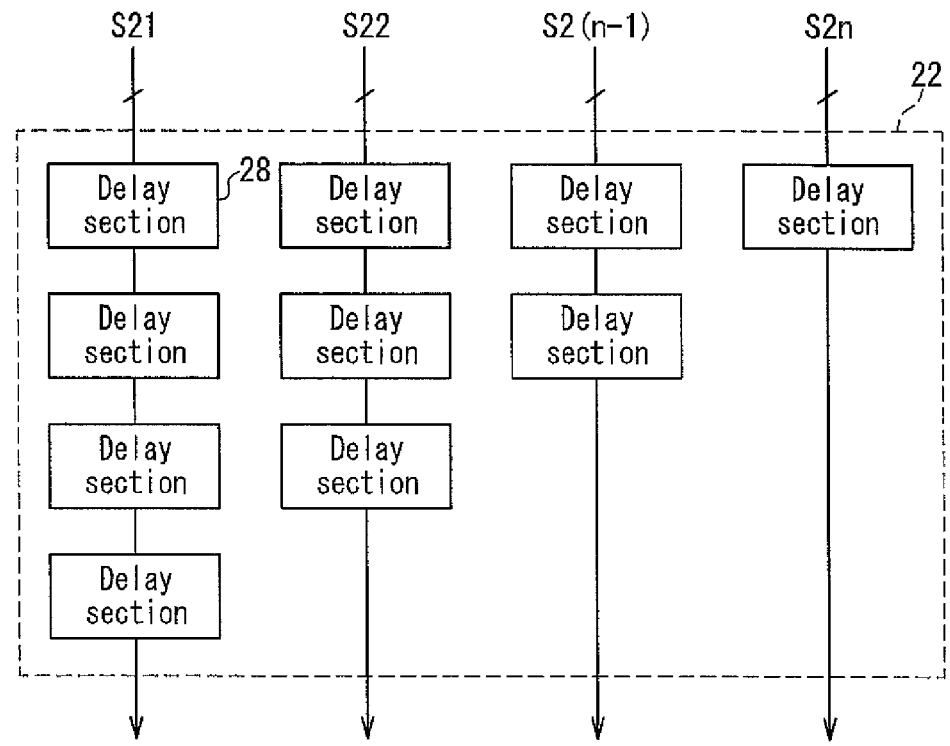
FIG. 6 is a block diagram showing a configuration example of a shift register unit included in the pipelined A/D converter.

FIG. 3 is a block diagram showing a configuration example of a pipeline stage P1k as a correction target for performing the method for correcting the flow as mentioned above. This pipeline stage P1k has a basic configuration including an adder 7, a low-bit-rate partial A/D converter 8, and a partial D/A converter 9 similarly to the conventional example as shown in FIG. 5, and further a reference voltage setting unit 11 and a digital value setting unit 12. Further, in the configuration, the connection states among the respective elements can be switched by the switches SW1-SW5.

The input analog signal AS1 or an output analog signal ASk of a more significant stage is inputted into the adder 7 through the switch SW1, and also inputted into the partial A/D converter 8 via the switch SW2. The output of the partial A/D converter 8, which is partial digital data S1k, is outputted as a pipeline stage output via the switch SW3 and also is inputted into the partial D/A converter 9. The reference analog signal outputted by the partial D/A converter 9 is inputted into the adder 7, and subjected to an operation with the input analog signal AS1 or an output analog signal ASk of a more significant stage. The resulting signal is amplified by a gain amplifier 10 so as to make an output analog signal AS(k+1), which will be supplied to a less significant stage.

Into the adder 7, an output signal of the reference voltage setting unit 11 is inputted through the switch SW4. Into the partial D/A converter 9, an output signal of the digital value setting unit 12 is inputted through the switch SW5. The reference voltage setting unit 11 is set to output +VREF/4 and −VREF/4 as reference voltages in accordance with the above-described correction input points 13, 14. Similarly, the digital value setting unit 12 is set to output (01).

The switches SW1-SW5 are switched selectively depending on whether or not the stage is set to be a correction target stage during a correction period or whether the period is a normal operation period or not. FIG. 3 shows a switching state for the case where the stage is set as a correction target during the correction period. When the stage becomes a correction target stage, the switches SW1-SW3 are turned OFF while switches SW4 and SW5 are turned ON. Thereby, input signals for a correction (+VREF/4 and −VREF/4) are supplied from the reference voltage setting unit 11, and digital output value (01) for a correction is supplied from the digital value setting unit 12. For the case of a period where the stage is not set as a correction target stage during a correction period or for the case of a normal operation period, the switches SW1-SW3 are turned ON and the switches SW4, SW5 are turned OFF.

Figure 8:
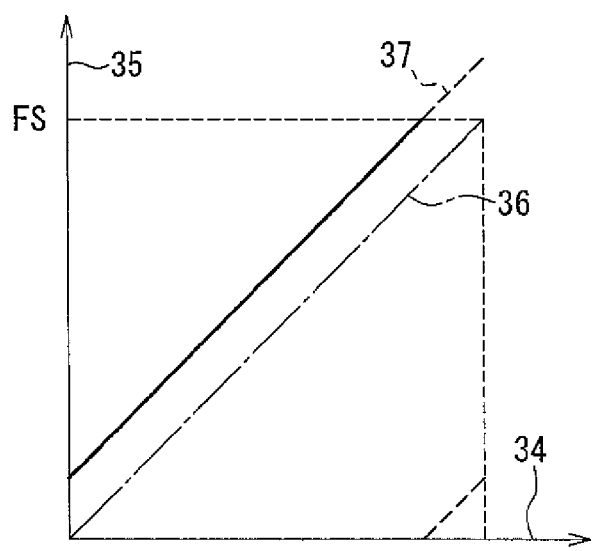
FIG. 8 is a diagram showing an example of input/output characteristics of an A/D converter.

FIG. 8 shows an example of correction effect according to the present embodiment. FIG. 8 shows input/output characteristics of a pipelined A/D converter according to a conventional example, but this can be applied also to a pipelined A/D converter according to the present embodiment. The flow in FIG. 2 is performed to correct the input/output characteristics as indicated with the characteristic line 37 as a solid line including a shift error, thereby approaching the ideal input/output characteristics indicated with the characteristic line 36 as an alternate long and short dashed line. Conventionally in input/output characteristics (characteristic line 37) including a shift error, excess of an output range (overflow) is alised (clipped in general), and thus output data is wasted. In contrast, by performing the above-mentioned correction, the output range can be used efficiently.

The pipelined A/D converter according to the present invention can utilize effectively the output range by correcting the upward and downward shift in the input/output characteristics generated due to the variation caused by fine-line processing or the like, and thus the pipelined A/D converter can be used for various applications such as digital still cameras and digital video cameras.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A pipelined A/D converter configured to: generate, from input analog signals, partial digital data corresponding to a part of bits, where the partial digital data is generated sequentially by cascaded multiple pipeline stages; adjust a timing delay through a pipeline procedure for the partial digital data obtained from the respective pipeline stages; and subsequently add the data together by use of a decoder unit so as to output digital data, each of the pipeline stages comprises:

a low-bit-rate partial A/D converter that quantizes either the input analog signal or an output analog signal outputted from the previous pipeline stage and generates the partial digital data;

a low-bit-rate partial D/A converter that converts the partial digital data outputted by the partial A/D converter into a reference analog signal;

an adder that performs addition/subtraction of the reference analog signal outputted by the partial D/A converter, with respect to the output analog signal; and a gain amplifier that amplifies an output signal from the adder and supplies the signal as the output analog signal to the next pipeline stage, wherein the pipelined A/D converter further comprises:

a correction value adding unit that is supplied with the digital data outputted by the decoder unit as a first input and a correction value as a second input, and adds the first input and the second input so as to provide output data;

a correction value calculating unit that calculates a median between the output data at two arbitrary points in input/output characteristics of the pipeline stage by using the output of the correction value adding unit as an input, calculates an error between the calculated median and an ideal median, saving the error as the correction value, and outputs the correction value to the correction value adding unit; and a control unit that sets a correction period other than the normal operation period and controls during the correction period the pipeline stage and the correction value calculating unit so as to perform a correction operation of calculating the error.

2. The pipelined A/D converter according to claim 1, wherein the least significant stage of the pipeline stages is configured by a flash A/D converter.

3. The pipelined A/D converter according to claim 1, wherein the control unit sets a less significant stage to be the pipeline stage as a correction target and controls input/output of the pipeline stage so as to perform the correction operation and then move sequentially to the more significant side.

4. The pipelined A/D converter according to claim 1, wherein the control unit sets input values and output values of the arbitrary two points for calculating the median with respect to the pipeline stage as a correction target.

5. The pipelined A/D converter according to claim 4, wherein the correction value calculating unit calculates the median by use of the output from the correction value adding unit corresponding to the two points set by the control unit.

6. The pipelined A/D converter according to claim 1, wherein the correction value calculating unit outputs zero before the correction operation so as to make the output from the correction value adding unit equivalent to the output from the decoder unit.

7. The pipelined A/D converter according to claim 1, wherein during the correction operation, the pipeline stage is controlled to interrupt a normal input and to input a set value corresponding to the arbitrary two points.

* * * * *